United States Patent [19]

Raymond

[11] 4,109,168
[45] Aug. 22, 1978

[54] CURRENT-TO-FREQUENCY CONVERTER

[75] Inventor: David Lee Raymond, Arcadia, Calif.

[73] Assignee: Analog Technology Corporation, Irwindale, Calif.

[21] Appl. No.: 760,686

[22] Filed: Jan. 19, 1977

[51] Int. Cl.$^2$ ............................................. H03K 1/16
[52] U.S. Cl. .................................... 307/271; 307/261; 307/229; 328/127; 324/99 D
[58] Field of Search ............... 307/271, 229, 230, 261, 307/262, 360; 328/127, 146, 147; 324/99 D; 332/9 R, 14

[56] References Cited

U.S. PATENT DOCUMENTS

| | | | |
|---|---|---|---|
| 3,022,469 | 2/1962 | Bahrs | 332/14 |
| 3,350,574 | 10/1967 | James | 307/262 |
| 3,376,431 | 4/1968 | Merrell | 307/229 |
| 3,594,649 | 7/1971 | Rauch | 328/127 X |
| 3,660,782 | 5/1972 | Friedman et al. | 307/271 X |
| 3,742,389 | 6/1973 | Hendrickson | 307/271 X |
| 3,778,794 | 12/1973 | Szabo et al. | 328/127 X |
| 3,902,139 | 8/1975 | Harrell | 307/271 X |
| 3,921,012 | 11/1975 | Marshall | 307/271 |
| 3,942,110 | 3/1976 | Milkovic | 307/271 X |

Primary Examiner—John S. Heyman
Attorney, Agent, or Firm—Kleinberg, Morganstern, Scholnick & Mann

[57] ABSTRACT

A current-to-frequency converter in which a succession of small charge feedback pulses is selectively generated to null the input current. The feedback pulses are generated by applying voltage pulses of precisely controlled magnitude to a precision capacitor to produce pulses of precisely-determined charge content. These pulses are then applied to a charge-dividing circuit including a matched pair of bipolar transistors. The charge dividing circuit bypasses the bulk of the charge in each pulse, while applying only a minute fraction of each pulse as the feedback current. The charge division ratio is maintained constant by the circuit in spite of temperature fluctuations.

23 Claims, 5 Drawing Figures

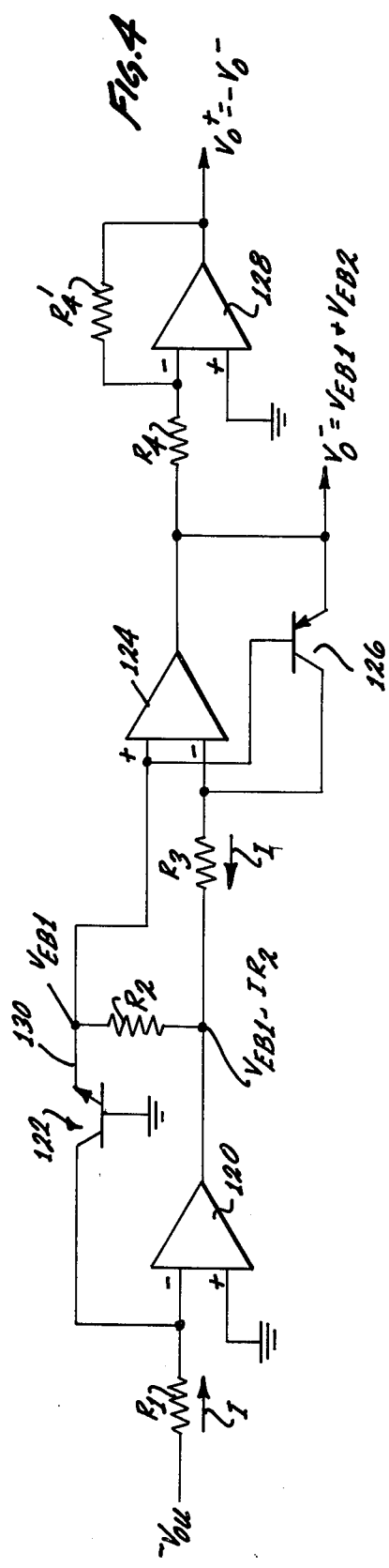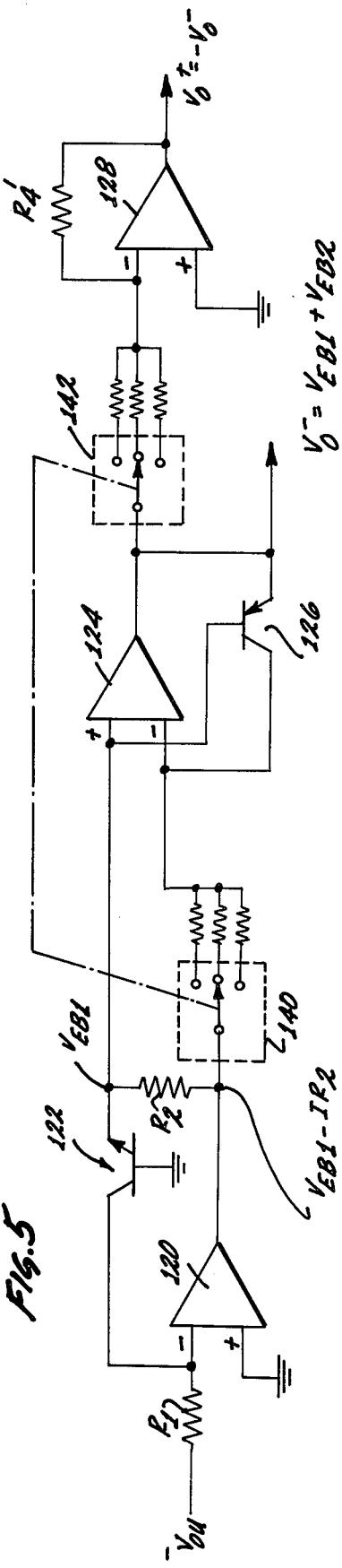

CURRENT-TO-FREQUENCY CONVERTER

BACKGROUND OF THE INVENTION

1. Field of the Invention

The present invention is in the field of current-to-frequency converters, and specifically discloses a circuit for converting very small bipolar currents ranging, for example, from $10^{-14}$ to $5 \times 10^{-6}$A. to frequencies ranging from 0 to 5 MHz. The currents to be measured typically originate in mass spectrometers, electron capture detectors, flame-ionization detectors, photomultipliers, etc., and the output of the circuit is typically used in digital circuits.

2. The Prior Art

A technique for generating pulses of precisely controlled charge content is disclosed in U.S. Pat. No. 3,921,012 to Marshall III.

The technique used by Marshall bears a resemblance to one disclosed in U.S. Pat. No. 3,022,469 to Bahrs et al.; in U.S. Pat. No. 3,289,271 to Gray; and in U.S. Pat. No. 3,742,389 to Henrickson.

As taught by those patents, the technique consists of applying a voltage increment to one plate of a capacitor. Both the voltage increment and the capacitance are precisely controlled. In response to the applied voltage increment, a quantity of charge $Q = C \Delta V$ flows into the opposing capacitor plate. The key advantage of this feedback pulse generation technique is that the quantity of charge Q in each pulse is independent of the voltage waveform used to drive the capacitor. In addition to achieving potentially greater accuracy, this capacitive technique results in a wider dynamic range and elimination of the stray capacitance problems associated with other methods.

In the Gray and Hendrickson patents referred to above, the charge feedback pulses are additively combined with the current to be measured without attenuation. This approach is adequate where the input currents to be converted are relatively large, but smaller charge feedback pulses must be generated or obtained to give the instrument greater sensitivity if minute input currents are to be converted to frequency with satisfactory accuracy.

In the Marshall III invention, the succession of charge pulses generated are applied to a conductor connecting a plate of each of two capacitors which function as a charge division circuit for the applied charge. The charge, having no direct current outlet path, builds up voltage on the capacitors, which would render the circuit inoperable in the relatively short time it takes to charge to the limit of the linear voltage range of the charging transistor. It is therefore necessary periodically to provide a dead time in the system operation during which the accumulated charge is cleared away by a specially provided discharge circuit. The need for a dead time places sampling period limitations on the circuit and thereby makes the conversion of current to frequency discontinuous.

In certain situations, such as when fast sampling is required, pulses lost during dead-times may produce significant errors and therefore constitute a fundamental limitation to minimum sampling period.

In discussing the prior art, Marshall, III, states that "current to frequency conversion using charge feedback through semiconductors cannot achieve the low leakage currents and high impedances necessary to perform the direct digitization of currents as small as $10^{-14}$A. without the complexity of constant external zero correction." As will be seen below, Applicant has invented a charge dividing circuit employing semiconductors which does exactly that.

The Marshall patent provides the prior art which is most nearly relevant to the present invention. A search that was conducted found the following patents that were addressed to similar problems but were far less relevant:

In U.S. Pat. No. 3,778,794 Szabo, et al, disclose an analog-to-pulse rate converter in which the input signal to be measured charges an integrating capacitor. A charge-level threshold is provided such that when the charge level on the integrator capacitor exceeds the threshold, a discharge control signal is initiated by control logic to remove equal predetermined amounts of capacitor charge from the integrator capacitor during successive clock cycles. The amount of charge in each of the discharging pulses is determined by applying a constant current for a fixed portion of the clock pulse period. This is a different technique and less precise than that used in the present invention. The charge delivered is the integral of the current waveform, and it is difficult to maintain precise control of the waveform at high frequencies and over a wide range of frequencies.

A current-to-frequency converter similar to that disclosed by Szabo, et al., is described in "High-Speed Charge-to-Current Data Domain Converter for Analytical Measurement Systems" by Woodruff and Malmstadt in Analytical Chemistry, Vol. 46, No. 9, August, 1974, Page 1162. The precisely determined charge feedback pulses are generated by using a high speed analog switch to alternately connect and disconnect a very stable reference voltage (V) across a resistor of resistance (R). This provides a stable current $I = V/R$. Since the switch is driven by a very accurate crystal clock oscillator, each ON time $\Delta t$ is accurately determined and the charge content is each pulse $q = \Delta t$ is also precisely determined.

The limitations of the mode of generating the feedback charge pulses used in the invention of Szabo, et al., and described in the paper by Woodruff and Malmstadt are described in Columns 2–4 of Marshall III (referred to above), which Columns are incorporated herein by reference. These problems include inability to precisely control the width of the pulse driving the resistor as well as inability to control the amplitude of the voltage pulse particularly at the megahertz repetition rates employed. Other problems include limited dynamic range and the undesirable effects of stray capacitance.

A well known class of analog-to-frequency instruments bears a superficial similarity with the present invention. Although those instruments use integrators and threshold devices comparable to those used in the present invention, the principle on which they operate is different.

In those prior-art instruments, a current or voltage to be measured is integrated over time by an integrator. The output of the integrator is applied to a threshold device which emits a signal when the threshold is exceeded. This threshold signal is used to initiate resetting of the integrator to its initial condition. The signal generated by the threshold device is not added to the quantity being measured so as to reduce or null that quantity. Instead, the signal generated by the threshold device always resets the output of the integrator to its initial condition.

Whatever accuracy the instruments may have depends on how precisely the threshold level and the integrating capacitance can be controlled. This is in contrast to the operating principle of the present invention, wherein a sequence of predetermined charge packets is additively combined with the input quantity to nullify it. In the present invention, the accuracy is independent of the threshold level and depends mainly on the precision with which the feedback charge pulses can be generated and applied.

The following patents are believed to fall into the latter-described class of instruments: U.S. Pat. No. 3,942,110 to Milkovic; U.S. Pat. No. 3,902,139 to Harrell; U.S. Pat. No. 3,660,782 to Friedman, et al.; U.S. Pat. No. 3,376,431 to Merrell; and U.S. Pat. No. 3,594,649 to Rauch. This class of instrument is also described in a paper by Lucero, Smith and Johnson, "A Hydrogen Flame Ionization Detector for Martian/Lunar Life Detection Experiments" published in Instrumentation in the Aerospace Industry, Volume 16, Page 176–186, (1970) by the Instrument Society of America (Paper No. LC 69-59 467).

SUMMARY

The current-to-frequency converter of the present invention is intended for converting low-level signals in the form of electrical currents to pulse trains having frequencies ranging from 0 to 5 MHz. Such signals typically originate in flame-ionization detectors, photomultipliers, and mass spectrometers.

As can be readily appreciated, such signals in many cases have a wide dynamic range, and the dynamic range of the converter must be correspondingly large. The current-to-frequency converter of the present invention exhibits an exceptionally large dynamic range, being usable with input currents from $10^{-14}A$ to $5 \times 10^{-6}A$. The noise threshold is $3 \times 10^{-14}A$, rms with a 1-second sample interval.

The feedback charge pulses used can be as small as $10^{-15}$ coulomb per pulse. A voltage-programmable feedback charge generator permits the manual selection of feedback pulses of $10^{-14}$, $10^{-13}$, or $10^{-12}$ coulomb per pulse. The frequency-to-current scale factor is the reciprocal of the charge per pulse.

The current-to-frequency converter of the present invention in a preferred embodiment responds to input currents of either polarity, even if the polarity changes during a measurement. Separate variable-frequency pulse-train outputs are provided for positive and negative currents. These two outputs may, if desired, be passed through an external OR gate, using one of the outputs for polarity determination. These outputs are TTL-level pulses 50 nanoseconds wide having a frequency range from 0 to 5 MHz. In another embodiment, the pulse train outputs are used to drive counters which display that current in binary or binary coded decimal form. In still another embodiment, the pulse train is converted to a voltage suitable for driving chart recorders and similar instruments.

When an input transient step of current is applied, the current-to-frequency converter of the present invention will correct the pulse frequency to its new steady-state value within 1 microsecond after the input step is applied from a source of up to 200 picofarad capacitance, and the new output pulse frequency is determined by the first two pulses following the transient. This fast response makes the converter of the present invention particularly well suited for use with rapidly scanned instruments such as mass spectrometers.

This high speed of response cannot be obtained continuously with converters such as that of Marshall, III referred to above, because the operation of that converter requires a dead time during which the accumulated charge is cleared out. The improvement over Marshall III is a direct result of Applicant's devising a novel charge attentuation technique using matched bipolar transistors in place of the capacitive current-dividing network used by Marshall III.

Marshall teaches that a transistor charge attenuating circuit cannot be devised because of the large leakage currents of such transistors and because of the temperature induced variations in those leakage currents. This assessment of transistor attenuation techniques was in part based on the assumption that the signals applied to the transistor had to be several volts in magnitude. However, in Applicant's invention, the overall system combination is so devised and configured that the signals applied to the transistors are of millivolt magnitude, and in this context Applicant has found the use of transistors to be entirely feasible and beneficial. Applicant has further found that temperature-induced variations can be readily controlled by using a matched pair of transistors that are either maintained at a constant temperature, or that are supplied by a temperature compensated power supply.

These and other novel features, which are believed to be characteristic of the invention both as to organization and method of operation, together with further objects and advantages thereof, will be better understood from the following description considered in connection with the accompanying drawings in which several embodiments of the invention are illustrated.

BRIEF DESCRIPTION OF THE DRAWINGS

FIG. 3 is a block diagram of an optional output circuit in accordance with one embodiment of the present invention;

FIG. 4 is a schematic diagram of an optional temperature-compensated power supply according to one embodiment of the present invention; and, FIG. 5 is a schematic diagram of a temperature-compensated power supply providing for manual range selection according to one embodiment of the present invention.

DESCRIPTION OF THE PREFERRED EMBODIMENT

Figure 1:
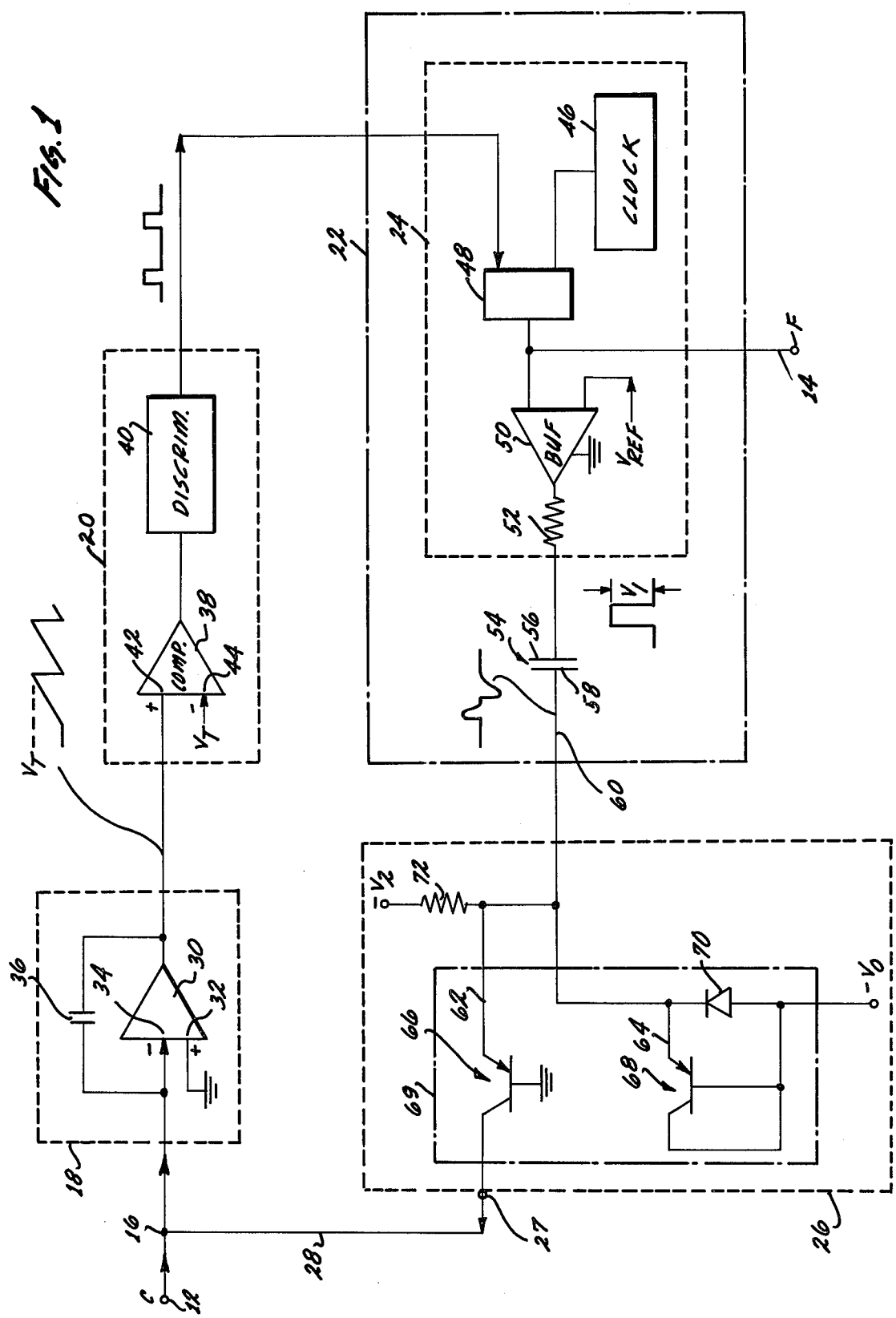
FIG. 1 is a block diagram of one embodiment of the present invention.

Referring now to the figures, the current-frequency converter of the present invention is shown in the block diagram of FIG. 1. The current to be converted to frequency is applied at the input terminal 12, and the variable frequency pulse train to which the current has been converted is presented at the output terminal 14. The circuit is in the form of a feedback loop or servo-mechanism with the feedback current summed with the applied current at the junction 16. The feedback current, as will be seen below consists of a number of discrete increments or bundles of electrical charge flowing in sequence along a conductor. By definition, the movement of electrical charge is a current, which may be further classed as direct or intermittent or alternating in accordance with the motion of the charge. Hence, in the following description, the terms "feedback current" and "feedback charge" will be used interchangeably. The major components of the system include an integrator 18, a threshold device 20, a charge-pulse generator 22 including a precision voltage-pulse generator 24, and a charge-pulse divider 26.

In essence, the system generates and applies a feedback charge on the conductor 28, which is used to null the current applied at the input terminal 12. The average magnitude of the feedback charge is controlled so as to maintain the difference between the applied current and the feedback current near zero.

Briefly stated, the input current charges the integrator 18 until a fixed threshold, $V_n$, in the threshold device 20 has been exceeded. When this occurs, a gating circuit permits a current-pulse generator 22 to generate a current pulse of precisely determined charge content. A predetermined portion of this current pulse is applied back to terminal 12 through the operation of the current-pulse divider 26 for use as the feedback current. If the current applied at input terminal 12 is a continuing current, then a continuing sequence of feedback pulses will be required to null the applied current. Larger applied currents will require greater numbers of feedback pulses per unit of time to nullify them. Thus, the frequency with which the feedback pulses are generated is proportional to the applied current. In the following paragraphs, the components making up the circuit will be described in greater detail.

In a preferred embodiment, the integrator 18 comprises a differential amplifier 30 whose positive input terminal 32 is grounded. The input and feedback currents are applied to the input terminal 34 of the differential amplifier 30. Integration is achieved by feeding back the output voltage through capacitor 36. In one embodiment, amplifier 30 can be a conventional JFET amplifier.

The input to the integrator 18 is the difference between the applied current and the feedback current. The difference is integrated over time through integrator 18. The time integral of a current has the dimensions of electrical charge. If no feedback current pulses were generated, the output of the integrator 18 would rise steadily in response to a steady current applied at imput terminal 12. In response to a single feedback current pulse, the rise of the output of the integrator 18 will be retarded or, more typically, reversed resulting in the sawtooth waveform shown.

Threshold device 20 determines how far the output of the integrator 18 will be permitted to rise before a feedback current pulse will be generated. The threshold device 20 in a preferred embodiment comprises a comparator 38 and a discriminator 40. The comparator 38, in a preferred embodiment is a differential amplifier. The output of the integrator 18 is applied to the positive terminal 42 of the comparator differential amplifier 38, while a reference threshold voltage $V_T$ is applied to the negative terminal 44. Thus, a positive output will be obtained from the comparator 38 only when the output of the integrator 18 exceeds the threshold voltage $V_T$. Discriminator 40 in one embodiment, may be a diode rectifier which passes only the positive portion of the output of comparator 38. This positive voltage signal is the output of threshold device 20. A number of other implementations of threshold device 20 are possible. For example, a monostable multivibrator could be used.

The presence of a positive output signal from threshold device 20 causes pulse gating circuit 48 to apply well-defined pulses, synchronized with the clock from clock-pulse generator 46, to buffer amplifier 50 as long as a proper-polarity output from the threshold device 20 is present.

The buffer amplifier 50 standardizes the voltage pulses generated by the pulse gating circuit 48 so that the pulses applied through resistor 52 to capacitor 54 all have a uniform voltage amplitude $V_1$. In one embodiment, buffer amplifier 50 is a limiting amplifier.

Thus, the combination of the clock-pulse generator 46, the pulse-gating circuit 48, buffer amplifier 50 and the resistor 52 together comprise a precision voltage pulse generator 24.

As the leading edge of the precision voltage pulse is applied to the first plate 56 of capacitor 54, a positive charge develops on that plate, while a negative charge is induced on the second plate 58 of capacitor 54. These induced negative charges are supplied by electrons in the conductor 60 moving toward the second plate 58 of the capacitor 54. This, in turn is equivalent to a positive current pulse flowing in the conductor 60 away from the capacitor 54.

Upon arrival of the trailing edge of the precision voltage pulse at the first plate 56 of the capacitor 54, its potential is returned to the reference level and, the induced electrons on the second plate 58 of capacitor 54 are released, causing them to flow away from the capacitor through the conductor 60. This, in turn, is equivalent to a negative current pulse flowing away from capacitor 54 through conductor 60. Thus, in response to each precision voltage pulse applied to the capacitor 54, a positive current pulse and a negative current pulse are produced in the conductor 60, corresponding to the leading and trailing edges of the precision voltage pulse. If the capacitance of capacitor 54 is $C_1$ then the positive and negative current pulses produced each contain an amount of charge equal to $C_1V_1$, providing the capacitor is fully charged by the end of the clock pulse. This is ensured by having the charging time constant $R_1C_1$ (where $R_1$ is the resistance of current-limiting resistor 52) small compared to the clock-pulse width.

It is noteworthy that in this mode of generating current pulses, the amount of charge in each pulse produced is independent, within a large range, of the duration of the precision voltage pulse and is similarly independent of the shape of that pulse. Only one parameter needs to be controlled with accuracy, and that is the amplitude of the precision voltage pulse $V_1$. Because practical circuit design considerations require generation of pulses on conductor 60 considerably larger than those required to discharge the integrator, the current pulses on conductor 60 must be reduced or attenuated before they can be employed as feedback current pulses. This attenuation is accomplished by current-divider circuit 26.

Briefly, current divider circuit 26 includes a matched pair of bipolar transistors 66, 68 having their emitters 62, 64 connected. The successive positive and negative current pulses produced by current pulse generator 22 on conductor 60 are applied to the connected emitters 62, 64. The negative current pulse is diverted to the power supply through diode 70. The positive current pulse is divided between the transistors 66, 68 in accordance with their conductivities. In one embodiment, the transistor 66 is biased so that its conductivity is approximately 1/10,000 that of the transistor 68 which is biased negatively. A negligible amount of the current may also flow through forward-biased diode 70. The portion of the positive current pulse flowing through the transistor 68 is bypassed through the power supply, because the collector and base of the transistor 68 are connected. The resistor 72 establishes a bias current through the diode 70 and thus a bias voltage for emitters 62 and 64. The portion of the positive current pulse flowing through the transistor 66 is presented at output terminal 27 as the feedback current applied to summing point 16 via conductor 28.

In one embodiment, a practical lower limit for the charge transferred through the capacitor 54 in each pulse is about $10^{-11}$ coulomb, with the precision voltage pulse on the order of 10 volts and the capacitance of capacitor 54 at one picofarad. Both the transistor 66 and the transistor 68 share the charging current in such a way that the transistor 66 transports only a small fraction of the applied current, typically a fraction as small as one part in $10^3$ so that the charge content of the feedback current pulses is as small as $10^{-14}$ coulomb per pulse.

The method by which the charge-dividing circuit 26 divides the charge can be explained in terms of the characteristics of a silicon transistor used in a preferred embodiment as follows:

$$V_{EB} = \frac{kT}{q} \ln\left(\frac{I_c}{I_o}\right) \text{(for } V_{CB} = 0) \quad (1)$$

where $V_{CB}$ = collector-to-base voltage
$V_{EB}$ = emitter-to-base voltage
$kT/q$ = a semiconstant proportional to absolute temperature T, equal to about 26 mV at 30° C
$I_c$ = collector current
$I_o$ = a non-bulk-resistance leakage current term.

The transistor 66 is connected so that its collector is held at zero volts by the integrating amplifier 30, and its base is grounded, thus insuring that $V_{CB}=0$. On the other hand, the collector and base of the transistor 68 are interconnected, so that, as in the case of the transistor 66, $V_{CB}=0$. The emitters of the two transistors are connected together, but their bases are separated by a small negative voltage, minus $V_0$. Thus, for all instantaneous values of emitter voltage, $$V_{EB1} = V_{EB2} - V_0 \quad (2)$$

or $$V_0 = V_{EB2} - V_{EB1} \quad (3)$$

Combining equations (1) and (3) gives $$V_o = \frac{kT}{q} \ln\left(\frac{I_{c2}}{I_{02}}\right) - \frac{kT}{q} \ln\left(\frac{I_{c1}}{I_{01}}\right) \quad (4)$$

or $$V_o = \frac{kT}{q} \ln\left(\frac{I_{c2}}{I_{c1}} \cdot \frac{I_{01}}{I_{02}}\right) \quad (5)$$

If the transistors 66, 68 are a well-matched pair, $I_{01} = I_{02}$ and equation (5) reduces to $$V_o = \frac{kT}{q} \ln \frac{I_{c2}}{I_{c1}} \quad (6)$$

Equation (6) illustrates that if the source of minus $V_0$ is chosen such that the value of $V_0$ tracks changes in absolute temperature proportionately, a fixed ratio between the collector currents of the two transistors results, and hence a fixed ratio prevails between the charge transported through the transistor 66 and the transistor 68. This, in turn, insures that a fixed ratio will exist between the charge transported through the transistor 66 and the net charge applied by the capacitor 54. In a preferred embodiment of the invention, which will be discussed below in connection with FIGS. 4 and 5, a circuit for providing a voltage $V_0$ which is proportional to the absolute temperature is employed.

In another embodiment of the circuit the temperature of the transistors 66 and 68 is stabilized by placing them in a small constant temperature controlled oven, 69 of FIG. 1, in which case $V_0$ needs only be a stable regulated voltage. As indicated in FIG. 1 it is preferable that diode 70 also be contained in oven 69, Resistor 72 may also be optionally placed in oven 69, if desired.

For attenuation values of 1/10 to 1/10,000, $V_0$ varies from about 60mV to about 240mV. This provides a range of control on feedback charge values from $10^{-12}$ to $10^{-15}$ coulomb per pulse.

A novel aspect of the current divider circuit 26 is that it transmits minute currents accurately and stably through the collector of a bipolar transistor, in a preferred embodiment. Traditionally bipolar transistors were regarded as having too low an impedance for use in electronic applications of this type, and therefore the bipolar transistor has rarely if ever been used in low current measurement apparatus. However, under the conditions imposed in the present embodiment, this type of coupling operates very satisfactorily.

In a preferred embodiment of the current divider circuit 26, the bipolar transistors used will preferably have low values of $I_0$, high collector-diode bulk resistance, and a collector-to-base operation potential near zero. The following numerical example is representative of the characteristics of the bipolar transistors used:

$I_c$ = 5mA at $V_{EB}$ = 0.6v, $T$ = 20° C $I_{CBO}$ = $10^{-9}$A at 30V.

The non-resistive leakage term, $I_0$, is given by $I_0 = Ie^{qV/kT}$ for $I>>I_0$.

For this case, $I_0 = 1.89 \times 10^{-13}$A, and the non-resistive component of collector current for $V_{CB} = +1$mV and for a reverse-biased emitter is given by $I = I_0(e^{qV/kT}-1) = 1.89 \times 10^{13}(e^{0.04}-1) = 7.7 \times 10^{-15}$A The bulk-resistive component of collector current at 1mV is $(10^{-3} \times 10^{-9}) 130 = 3.3 \times 10^{-14}$A. The aggregate leakage is therefore, $4 \times 10^{-14}$A, which is small compared to the gate currents of the integrating amplifier 30. Providing that the amplifier summing point 16 is properly referenced near zero, it is then reasonable to use bipolar transistors to couple minute feedback current pulses to the integrator 18 without producing excessive drift or noise distortion.

The negative current pulse on conductor 60 of FIG. 1 produced by the capacitor 54 is bypassed through the diode 70 to the $-V_0$ supply. No part of the negative current pulse produced on conductor 60 flows through either the transistor 66 or the transistor 68.

With respect to the converter of FIG. 1, it should be noted that certain current sources such as ionization chambers, proportional counters, and photomultipliers may produce input current pulses that are in excess of the dynamic current feedback of the instrument, but are nonetheless linearly measurable by the converter so long as the voltage at the integrator of the integrated input current pulse does not exceed the saturation voltage of the integrator amplifier. Referring to FIG. 1 the charge content of the maximum current impulse capable of being measured linearly by the circuit is given by $$Q_{i_{max}} = C_{fb} V_{max}$$

where $Q_{i_{max}}$ = maximum time integral of current impulse subject to linear integration
$C_{fb}$ = capacitance of capacitor 36
$V_{max}$ = saturation voltage of amplifier 30

For charge values up to $Q_{i_{max}}$, the integrating amplifier 18 can charge to voltages in excess of the threshold $V_T$ up to a maximum of $V_{max}$. The discriminator remains "on" until feedback pulses, occurring at a rate equal to the clock-pulse frequency, discharge capacitor 36 to a voltage less than $V_T$. The total number of counts thus obtained is $Q_i$/charge per pulse.

In one preferred embodiment where $C_{fb} = 10$ pF and $V_{max} = 10$V, $Q_{i_{max}} = 10^{-10}$ coulomb.

The system of FIG. 1 generates positive current feedback pulses on conductor 28 and thus is intended for the conversion of negative applied currents to frequency, Such a system is useful in many applications where it is known in advance that the applied current is of negative polarity. Other applications demand the use of a system that can operate with either or both positive and negative applied currents. The circuit of FIG. 1 may be altered to adapt it for the measurement of positive currents by replacing the PNP matched pair of transistors 66, and 68 of FIG. 1 with an NPN matched pair, and reversing the polarity of the diode 70, the comparator amplifier 38 and the precision voltage pulse among other things. However, if it is desired to convert both positive and negative applied currents to frequency, the embodiment in FIG. 2 may be employed advantageously.

Figure 2:
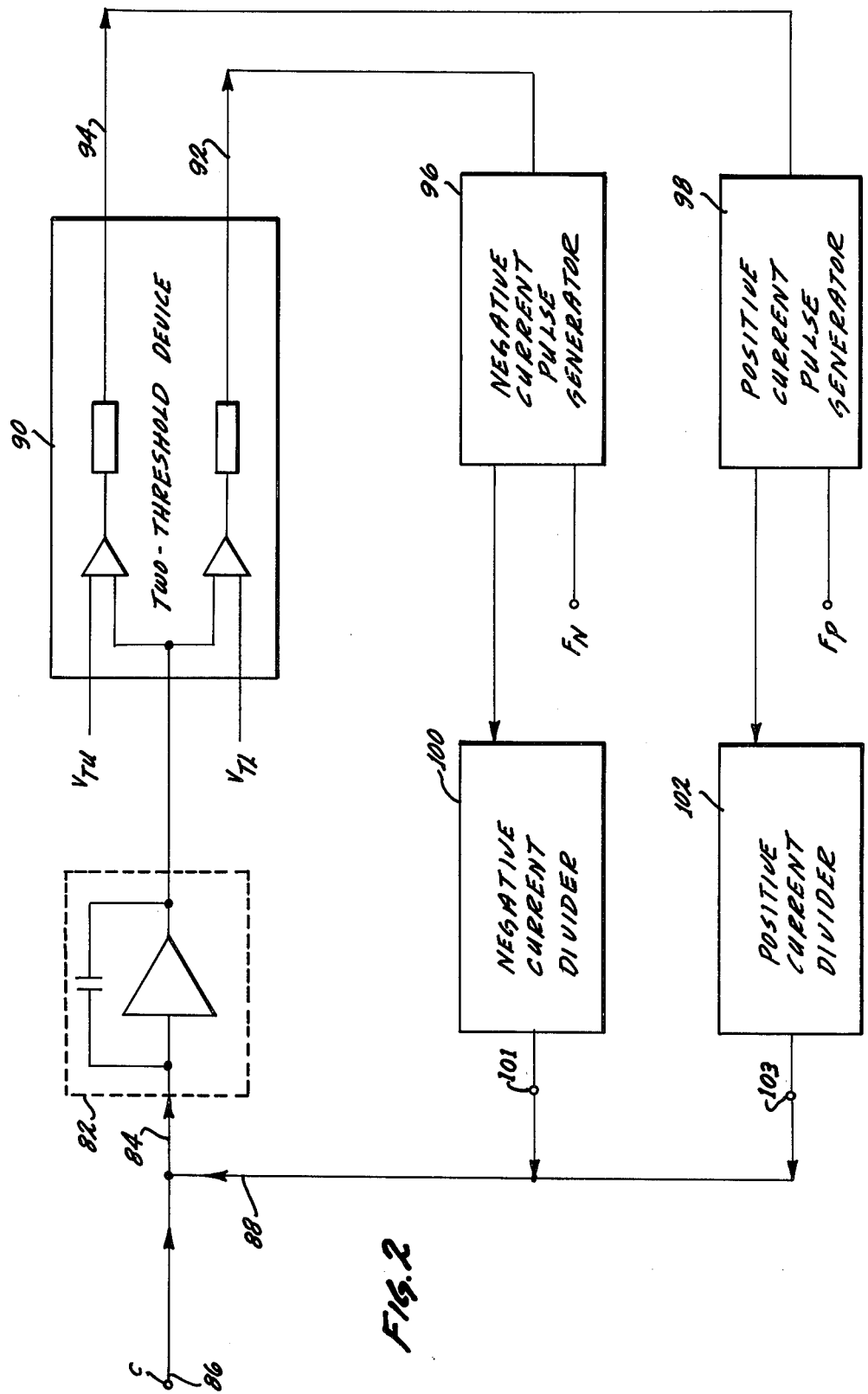
FIG. 2 is a block diagram of a preferred embodiment of the current-to-charge converter of the present invention for use with input currents of both polarities.

In FIG. 2, an integrator 82, similar to the integrator 18 of FIG. 1 is used to generate the time integral of the differential current on the conductor 84, that current being the sum of the current applied at input terminal 86 and a feedback current present on conductor 88.

The output of the integrator 82 is fed to the two-threshold device 90.

The two-threshold device implements upper and lower threshold levels, $V_{TU}$ and $V_{TL}$, between which it is desired to maintain the input to the device. Such a device could be formed by the parallel combination of threshold devices similar to the threshold device 20 of FIG. 1, the devices combined being "mirror images" of each other, electrically. No output results from the two-threshold device 90 of FIG. 2 as long as the input lies between the threshold levels. If the input exceeds the upper threshold level, an output signal is developed on conductor 94, while if the input level falls below the lower threshold level, an output signal is developed on conductor 92.

Negative and positive current feedback pulses are developed in response to the signals on the conductors 92 and 94 respectively. Current pulses are generated by the pulse generators 96 and 98, each of which is similar to the current pulse generator 22 of FIG. 1. The negative current pulses are attenuated by the negative current divider 100 and the positive current pulses are attenuated by the positive current divider 102. Each of the current dividers 100, 102 is similar to the current divider 26 of FIG. 1 with appropriate polarity modifications. The negative and positive fractional pulses are presented as outputs at terminals 101 and 103 of negative current divider 100 and positive current divider 102, respectively. Thus, a novel aspect of the converter shown in FIG. 2 is the use of the two-threshold device 90 to provide input to parallel negative and positive feedback pulse generating circuits.

A current-to-frequency converter implementing the embodiment shown in FIG. 2 was built and its performance has been found to exceed that of converters using prior art principles. The combined performance capability, including a frequency range of 0 to 5 megahertz, a threshold level of $10^{-14}$A, a pulse-period correction speed of less than 1 microsecond, integral non-linearities of less than 0.5%, inaccuracies of less than 1%, continuous operation, and voltage-programmable sensitivity represents a significant new achievement and greatly simplifies performing a broad range of current measurements.

FIG. 3 shows apparatus for use with the embodiment of FIG. 1 or FIG. 2, for converting the frequency generated to a binary number and/or display. The frequency output of the converter of FIG. 1 is available at terminal 14. This frequency is in the form of a sequence of pulses. The output at terminal 14 is used as an input to AND gate 110 of FIG. 3. The other input to the AND gate 110 is a pulse of predetermined length produced by the interval timer 112. When both inputs are present at the same time, the pulse train input from terminal 14 of FIG. 1 is gated through AND gate 110 to activate binary counter and display unit 114. That unit, in a preferred embodiment, produces 31 parallel data lines of regular binary-coded data. If a positive current is present, the regular binary coding is used, but if the current is negative the binary 2's complement is provided. In another embodiment the data is provided in binary-coded decimal (BCD) form.

The circuit of FIG. 4 is used in the embodiment described above wherein a constant current-division ratio is achieved at various temperatures by providing a power supply voltage $V_0$ that is proportional to the absolute temperature at which the transistors 66 and 68 of FIG. 1 are operated. The circuit of FIG. 4 is designed to provide a voltage $V_0$ that is stable at any particular temperature and is proportional to the absolute temperature.

As shown in FIG. 4, the temperature-compensating power supply includes an operational amplifier 120 having a transistor 122 in its feedback loop and a second operational amplifier 124 having a second transistor 126 in its feedback loop. An inverting unity-gain amplifier 128 is used to provide both positive and negative voltages of magnitude $V_0$, for use in the embodiment of FIG. 2.

The base of the transistor 122 being grounded, its emitter-to-base voltage on conductor 130 is equal to $V_{EB1}$. Conductor 130 is connected to the base of the transistor 126. If the emitter-to-base voltage of the transistor 126 is denoted by $V_{EB2}$, then $$V_{EB1} = -\frac{kT}{q} \ln \frac{I_{c2}}{I_{02}} \tag{7}$$

and $$V_{EB2} = \frac{kT}{q} \ln \frac{I_{c1}}{I_{01}} \tag{8}$$

The output of the second amplifier is given by:

$$V_O^- = V_{EB1} + V_{EB2} = -\frac{kT}{q} \ln \left[ \frac{I_{C2}}{I_{C1}} \cdot \frac{I_{01}}{I_{02}} \right] \tag{9}$$

From this equation, it can be seen that $V_0^-$ is proportional to the absolute temperature at which the transistors 122 and 126 are operated, since the ratio of $I_{C2}$ to $I_{C1}$ is determined by the values of the resistances used in the circuit of FIG. 4.

The circuit of FIG. 5 is an alternative embodiment of the temperature-compensated power supply in which a switch 140 is used to provide for selection of the resistance $R_3$. This in turn permits selection of a desired current-division ratio. The switch 140 is ganged with the switch 142. The purpose of switch 142 is to provide further compensation for the differences that might exist between opposite-polarity feedback-charge-pump pairs of transistors such as those used in the current divider circuit of FIG. 2. In still other embodiments, not shown, the values of the resistances $R_3$ and $R_4$ are continuously variable.

Thus, there has been described a current-to-frequency converter having a unique feedback-pulse-generating circuit that creates feedback current pulses having a precisely determined charge content and accurately attenuates those pulses in a current dividing circuit to obtain an attenuated current pulse for use in nulling an applied current. Various embodiments have been described, which permit operation with positive and negative applied currents, and which provide means for maintaining the same charge division ratio at all operating temperatures. The output frequency of the converter is converted to a parallel binary form in one embodiment.

What is claimed is:

1. A circuit for generating a current pulse containing an accurately-determined minute quantity of electrical charge, comprising:
   a current pulse generator for generating, in response to an input signal, an output current pulse containing a precise, pre-determined quantity of electrical charge; and
   a current divider connected to said current pulse generator for dividing each current pulse supplied by said current pulse generator and having an output terminal at which a small constant fraction of each current pulse is presented,
   said current divider further comprising a pair of transistors connected in parallel to receive each current pulse, one of said transistors providing a conductive path to the output terminal and the other of said transistors providing a conductive shunt path for each current pulse, said transistors being biased to operate at different operating points of their characteristics, at which the conductances of the transistors are in a predetermined ratio, a small substantially constant fraction of each current pulse supplied by said current pulse generator being conducted through said one of said transistors to the output terminal.

2. The circuit of claim 1 wherein the emitters of said pair of transistors are connected in parallel to said current divider to receive each current pulse.

3. The circuit of claim 2 wherein said pair of transistors is a pair of bipolar transistors having substantially matched non-bulk resistance leakage currents, and further comprising circuit means for controlling the difference between the emitter-to-base voltages of said transistors to be proportional to the absolute temperature of said transistors.

4. The circuit of claim 1 wherein said pair of transistors is a pair of bipolar transistors having matched non-bulk-resistance leakage currents and further comprising means for maintaining said pair of bipolar transistors at a constant absolute temperature.

5. The circuit of claim 1, wherein said current pulse generator further comprises a precision voltage pulse generator for generating in response to the input signal a voltage pulse whose amplitude is precisely determined.

6. The circuit of claim 5, wherein said current pulse generator further comprises a capacitor connected in series with said precision voltage pulse generator and having a first plate and a second plate, for generating a current pulse on its second plate containing an accurately determined quantity of charge in response to the voltage pulse generated by said precision voltage pulse generator and applied to the first plate of said capacitor.

7. The circuit of claim 6 wherein, in response to the voltage pulse supplied by said precision voltage pulse generator, said capacitor generates in succession two current pulses of opposite polarity in response to the leading and trailing edges of the voltage pulse, one of which is of a desired polarity, and further comprising a diode connected to the second plate of said capacitor for bypassing the current pulse of undesired polarity.

8. A charge feedback current-to-frequency converter comprising:
   an integrator for generating as an output the time-integrated difference between an applied current to be converted to frequency and a feedback current;
   a threshold device connected to receive the output of said integrator, for generating an output signal when the output of said integrator exceeds a predetermined level;
   a current pulse generator connected to said threshold device for generating in response to the output signal generated by said threshold device an output current pulse containing a precise predetermined quantity of electrical charge; and,
   a current divider connected to said current pulse generator for dividing each current pulse supplied by said current pulse generator and having an output terminal at which a small constant fraction of each current pulse is presented,
   said current divider further comprising a pair of transistors connected in parallel to receive each current pulse, one of said transistors providing a conductive path to the output terminal and the other of said transistors providing a conductive shunt path for each current pulse, said transistors being biased to operate at different operating points of their characteristics, at which the conductances of the transistors are in a predetermined ratio to conduct a small substantially constant fraction of each current pulse supplied by said current pulse generator through said one of said transistors to the output terminal for use as the feedback current.

9. The circuit of claim 8 wherein the emitters of said pair of transistors are connected in parallel to receive each current pulse.

10. The charge feedback current-to-frequency converter of claim 9 wherein said pair of transistors is a pair of bipolar transistors having matched non-bulk-resistance leakage currents, and wherein the difference between the emitter-to-base voltages of said transistors is controlled to be approximately proportional to the absolute temperature of said transistors.

11. The charge feedback current-to-frequency converter of claim 8, wherein said pair of transistors is a pair of bipolar transistors having matched non-bulk-resistance leakage currents and wherein said pair of bipolar transistors is maintained at a substantially constant absolute temperature.

12. The charge feedback current-to-frequency converter of claim 8, wherein said current pulse generator further comprises a precision voltage pulse generator for generating in response to the input signal a voltage pulse of predetermined amplitude.

13. The charge feedback current-to-frequency converter of claim 12, wherein said current pulse generator further comprises a capacitor connected in series with said precision voltage pulse generator and having a first plate and a second plate, for generating a current pulse on its second plate containing an accurately predetermined quantity of charge in response to the voltage pulse generated by said precision voltage pulse generator and applied to the first plate of said capacitor.

14. The charge feedback current-to-frequency converter of claim 13, wherein, in response to the voltage pulse supplied by said precision voltage pulse generator, said capacitor generates in succession two current pulses of opposite polarity in response to the leading and trailing edges of the voltage pulse, one of which is of a desired polarity, and further comprising a diode connected to the second plate of said capacitor for bypassing the current pulse of undesired polarity.

15. The charge feedback current-to-frequency converter of claim 8, further comprising a gated binary counter responsive to said output current pulses, to count the number of such pulses occurring in a predetermined time interval and to display the number in binary form.

16. In a charge feedback current-to-frequency converter of the type wherein a current of known polarity but unknown magnitude is nulled by an average current of opposite polarity, said nulling current consisting of current pulses of predetermined charge content generated when the integrated difference between the unknown current and the nulling current exceeds a preset threshold causing a threshold device to generate an output signal, an improved nulling current pulse generator comprising:
a current pulse generator connected to the threshold device and responsive to its output signal for generating each time the preset threshold is exceeded a current pulse containing a precisely determined quantity of electrical charge; and
a current divider connected to said current pulse generator for dividing each current pulse supplied by said current pulse generator and having an output terminal at which a small constant fraction of each current pulse is presented,
said current divider further comprising a pair of transistors connected in parallel to receive each current pulse, one of said transistors providing a conductive path to the output terminal and the other of said transistors providing a conductive shunt path for each current pulse, said transistors being biased to operate at different operating points of their characteristics, at which the conductances of the transistors are in a predetermined ratio, to conduct a small substantially constant fraction of each current pulse supplied by said current pulse generator through said one of said transistors to the output terminal.

17. In a charge-feedback current-to-frequency converter of the type wherein a current of a known polarity but unknown magnitude is nulled by an average current of opposite polarity, said nulling current consisting of current pulses of predetermined charge content generated when the integrated sum of the unknown current and the nulling current exceeds a preset threshold causing a threshold device to generate a signal, an improved nulling current pulse generator comprising:
a precision voltage pulse generator connected to the threshold device, for generating as an output a voltage pulse whose amplitude is precisely determined in response to the signal generated when the threshold is exceeded;
a capacitor, having first and second plates, connected in series with said precision voltage pulse generator, for generating in succession in its second plate in response to the leading and trailing edges of the voltage pulse supplied by said precision voltage pulse generator and applied to the first plate of said capacitor, two current pulses of opposite polarity and accurately predetermined charge content, one of which is of a desired polarity;
a diode connected to the second plate of said capacitor for bypassing the current pulse of undesired polarity; and,
a pair of transistors having their emitters connected to the second plate of said capacitor, said transistors biased to operate at different predetermined operating points on their characteristics, to maintain the conductances of the transistors in a substantially fixed ratio to conduct a small substantially constant fraction of the input current pulse of desired polarity through one of said transistors for use as a nulling current pulse of predetermined charge content.

18. The improved nulling current pulse generator of claim 17 wherein said pair of transistors is a pair of bipolar transistors having matched non-bulk-resistance leakage currents, and wherein the difference between the emitter-to-base voltages of the transistors is controlled to be approximately proportional to the absolute temperature of the transistors.

19. The improved nulling current pulse generator of claim 17 wherein said pair of transistors is a pair of bipolar transistors having matched non-bulk resistance leakage currents and wherein said pair of bipolar transistors is maintained at a substantially constant absolute temperature.

20. A method of generating a current pulse containing an accurately determined minute quantity of electrical charge in response to an applied voltage pulse, comprising the steps of:
- (a) applying a voltage pulse of precisely controlled amplitude V to a first plate of a capacitor of capacitance C, whereby output current pulses of opposite polarity are generated in succession, each conveying an amount of electrical charge equal to CV, one pulse being of a desired polarity and the other pulse being of an undesired polarity;
- (b) bypassing the output current pulse of undesired polarity;
- (c) applying the output current pulse of desired polarity to two parallel connected conductive transistors having a predetermined ratio of conductances to obtain a small fraction of the current pulse as an output of one of said parallel-connected conductive transistors while bypassing the remainder of the current pulse through the other transistor.

21. A method for generating a current pulse containing an accurately determined subnanocoulomb quantity of electrical charge in response to an applied signal comprising the steps of:
- (a) generating in response to the applied signal, a voltage pulse of fixed amplitude V;
- (b) applying the generated voltage pulse through a capacitor of capacitance C, to form two successive current output pulses of opposite polarity in response to the leading and trailing edges respectively of the generated voltage pulse, whereby each of the output current pulses conveys an amount of electrical charge equal to CV;
- (c) bypassing output current pulses of undesired polarity through a diode; and
- (d) applying output current pulses of a desired polarity to a current-dividing circuit, including a matched pair of bipolar transistors biased to operate at different points on their characteristics and having their emitters connected, whereby a small constant fraction of each current pulse is passed by one of the transistors as an output while the remainder of each current pulse is shunted through the other transistor.

22. A circuit for generating a current pulse containing an accurately-determined minute quantity of electrical charge, comprising:
- a current pulse generator for generating, in response to an input signal, an output current pulse containing a precise predetermined quantity of electrical charge; and,
- a current divider connected to said current pulse generator for dividing each current pulse supplied by said current pulse generator and having an output terminal at which a small constant fraction of each current pulse is presented,
- said current divider further comprising a pair of semiconductor devices connected in parallel to receive each current pulse, one of said semiconductor devices providing a conductive path to the output terminal and the other of said semiconductor devices providing a conductive shunt path for each current pulse, said semiconductor devices being biased to operate at different operating points of their characteristics, at which the conductances of the semiconductor devices are in a predetermined ratio to conduct a small substantially constant fraction of each current pulse supplied by said current pulse generator through said one of said semiconductor devices to the output terminal.

23. The circuit of claim 22 wherein predetermined like elements of said semiconductor devices are connected in parallel to receive each current pulse.

* * * * *